United States Patent

[11] 3,581,240

[72] Inventor Ralph T. Enderby
Bellwood, Ill.

[21] Appl. No. 790,726
[22] Filed Jan. 13, 1969
[45] Patented May 25, 1971
[73] Assignee Motorola, Inc.
Franklin Park, Ill.

[54] FREQUENCY MODULATED SOLID STATE CRYSTAL OSCILLATOR PROVIDING A PLURALITY OF CENTER FREQUENCIES
8 Claims, 1 Drawing Fig.

[52] U.S. Cl. .......... 332/26, 307/320, 325/25, 331/36, 331/116, 331/161, 332/30, 333/72
[51] Int. Cl. .......... H03c 3/28
[50] Field of Search .......... 332/26, 302, 30; 325/115, 17, 25, 145; 331/116, 36 C, 177 V, 161, 162; 307/320; 333/72

[56] References Cited

UNITED STATES PATENTS

| | | | |
|---|---|---|---|
| 1,984,424 | 12/1934 | Osnos | 331/161 |
| 2,575,363 | 11/1951 | Simons | 331/161X |
| 2,805,400 | 9/1957 | Seddon | 331/162X |
| 3,118,116 | 1/1964 | Freedman | 331/161 |
| 3,358,244 | 12/1967 | Ho et al. | 331/177VX |
| 3,100,886 | 8/1963 | Marks | 325/111X |

*Primary Examiner*—Alfred L. Brody
*Attorney*—Mueller & Aichele

ABSTRACT: Frequency modulated, solid state oscillator which oscillates at any one of a plurality of center frequencies in response to the positioning of a selector switch that connects a selected center frequency determining circuit to the oscillator. Each of the center frequency determining circuits includes a crystal operating in its series resonant mode, an inductor for tuning, and a resistor for suppressing undesirable crystal operation. Frequency modulation is accomplished by impressing a modulating voltage across a varactor included in the frequency control circuit of the oscillator to thereby change its capacitance and consequently change the frequency of oscillation.

PATENTED MAY 25 1971 3,581,240
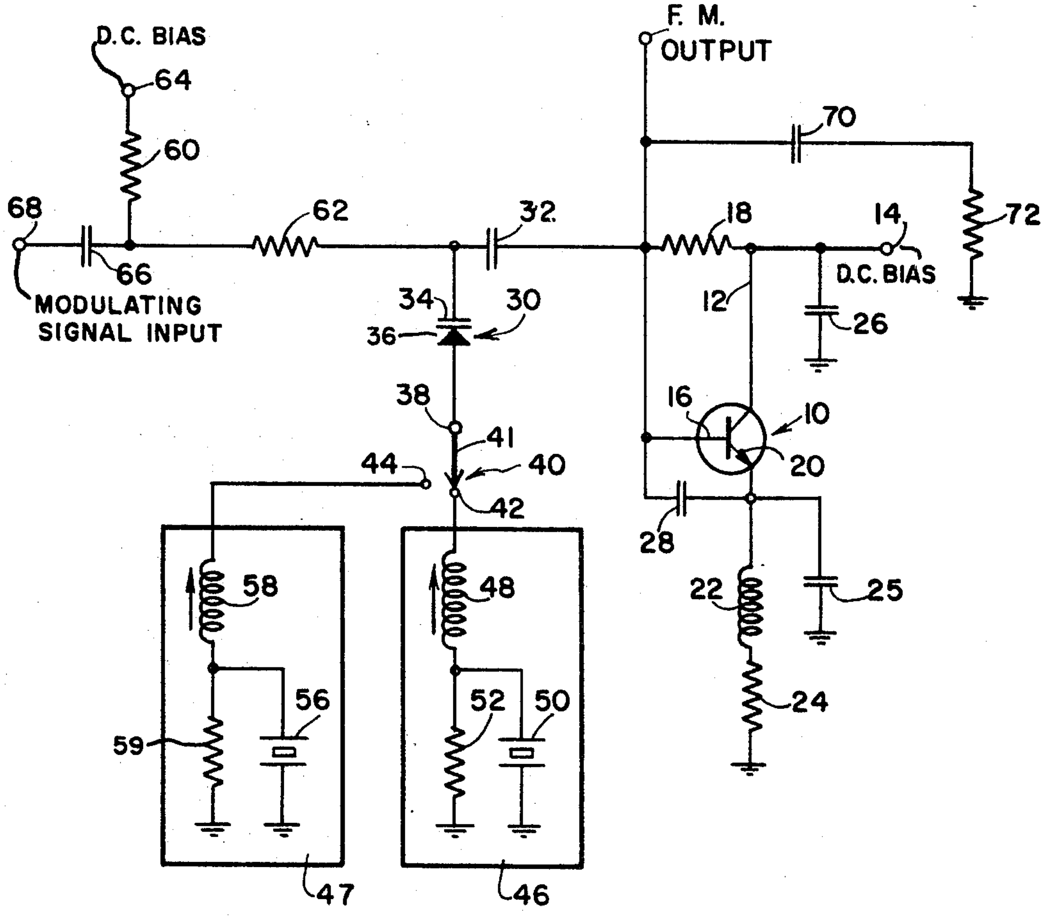
Inventor
RALPH T. ENDERBY
BY
Mueller, Aichele & Rauner
ATTYS.

FREQUENCY MODULATED SOLID STATE CRYSTAL OSCILLATOR PROVIDING A PLURALITY OF CENTER FREQUENCIES

BACKGROUND OF THE INVENTION

Solid state oscillators having a variety of configurations have been designed for use in frequency modulated transmitters operating within one frequency band. In these configurations piezoelectric crystals, operating in series and parallel modes, have been utilized to stabilize the center frequency of oscillation. Furthermore, voltage variable capacitors whose capacitance varies in accordance with the amplitude of a modulating voltage have been included in the frequency determining circuits of such oscillators to deviate the frequency of oscillation above and below the center frequency thus causing frequency modulation (FM) of an output signal. After multiplication of the FM output signal the amount of frequency deviation thereof, as determined by the usable change of varactor capacitance and the Q of the crystal, may be sufficient for operation about a center frequency in a communication band.

There are many applications, however, wherein it is desirable to provide a crystal controlled oscillator that is capable of producing modulation about several possible center frequencies, such as for use in a transmitter that operates on a plurality of adjacent center frequencies in one communication band or on center frequencies in different bands. This type of transmitter could be, for example, a hand held communication device carried by a police officer on a beat which enables him to use one frequency band to exchange information with his partner, another band to contact a patrolman in a police car patroling the area, and still another band to call police department headquarters, etc. Although prior art frequency modulated crystal controlled oscillators might provide satisfactory operation for single center frequency operation, their configuration are not readily adaptable to the above multicenter frequency operation. Also, it is desirable that the portable multiband units be reliable, compact and lightweight.

SUMMARY OF THE INVENTION

It is an object of the present invention to provide a frequency modulated, crystal controlled oscillator formed by a simple and inexpensive circuit.

Another object of the invention is to provide a frequency modulated, crystal controlled oscillator which is reliable, and compact, can be provided in lightweight form, and which utilizes the least number of parts.

Another object of the invention is to provide a solid state, frequency modulated, crystal controlled oscillator including a voltage variable capacitor as the frequency varying device and providing operation on a plurality of center frequencies, each of which can be easily selected by the transmitter operator.

The frequency modulated oscillator of the invention includes a transistor having its collector connected to signal ground and its emitter connected to a first capacitor for developing a voltage which is fed back to the transistor's base through a second capacitor for sustaining oscillation. One terminal of a voltage variable capacitor, such as a varactor, is coupled to the base of the transistor through a third capacitor; and its other terminal is connected to the wiper of a rotary switch so that the varactor can be selectively connected through the switch to each of a plurality of frequency determining networks, thereby effectuating sinusoidal oscillation at each of a plurality of predetermined center frequencies. Every one of these center frequency determining networks is comprised of a crystal operating in its series resonant mode, which has one terminal connected to ground and its other terminal connected both through a variable inductor to a switch contact and through a resistor back to ground. By manufacturing each crystal to be series resonant at one of the desired center frequencies of operation, and by adjusting the inductor to resonate with the equivalent series capacitance presented by the varactor in combination with the first, second and third capacitors at the series resonant frequency of the crystal, the network can be pretuned to provide the desired center frequency of oscillation. The resistor of the network provides a DC path for the varactor bias current to ground and suppresses unwanted modes of oscillation inherent in the crystal. A modulating voltage impressed across the varactor will change its capacitance to consequently shift or deviate the frequency of oscillation above and below the selected center frequency thus providing a frequency modulated output signal which is coupled through a coupling capacitor from the base of the transistor to a load which might be a selected tank circuit tuned to some harmonic of the selected oscillation for frequency multiplication, a buffer, an amplifier or some other circuit which can utilize the FM signal.

BRIEF DESCRIPTION OF THE DRAWING

The single FIGURE of the drawing illustrates the frequency modulated crystal oscillator of the invention.

DETAILED DESCRIPTION OF THE PREFERRED EMBODIMENT

The circuit of the invention includes a transistor 10 having its collector 12 directly connected to a power supply terminal 14, which provides a bias voltage having a regulated amplitude. Its base 16 is connected to terminal 14 through resistor 18, and its emitter 20 is coupled to ground or a reference potential through the series connection of radio frequency (RF) choke 22 nd resistor 24 to provide a return path for the bias current. Capacitor 26 provides an RF ground at collector 12 thereby keeping the oscillator signal out of the regulated power supply. Bias resistors 18 and 24 are selected to initially cause Class A operation of the transistor, so that oscillation will start with the application of the biasing voltage from terminal 14. Capacitor 25 which is connected from the emitter 20 to ground provides a potential that is fed back to base 16 through capacitor 28 for sustaining oscillation. Once oscillation has begun, the transistor is self-biased into Class C operation.

The frequency determining circuit of the oscillator includes varactor 30 whose cathode 34 is coupled through capacitor 32 to base 16 of transistor 10. Anode 36 of varactor 30 is connected through terminal 38 of rotary switch 40 to wiper 41 which can be selectively positioned to make contact with switch contacts 42 and 44, which are respectively connected to center frequency determining networks 46 and 47. When the selector switch 40 is in the position shown, the center frequency of oscillation controlled by network 46 including the series combination of variable inductor 48 and crystal 50 which are connected in series with varactor 30 to ground. Crystal 50 is constructed to have a predetermined frequency equal to a desired center frequency of oscillation and to have a Q which will allow frequency deviation of the oscillator within the desired band. Since crystal 50 is operated in its series resonant mode, it consequently forms a short circuit at the desired resonant frequency. Variable inductor 48 in combination with the series capacitance presented by varactor 30, coupling capacitor 32, feedback capacitor 28, and capacitor 25 forms a series resonant circuit at the frequency of crystal 50. Inductor 48 is adjustable to tune the series resonant circuit to the desired frequency. Resistor 52 damps out unwanted modes of oscillation in crystal 50.

By switching wiper 41 of selector switch 40 to the position engaging contact 44, another center frequency determining circuit 47 is connected between varactor 30 and ground. Although the configuration of circuit 47 is identical to the configuration of circuit 46, crystal 56 is constructed to provide another desired center frequency of oscillation, which might be in a band adjacent to the one provided by crystal 50, and inductor 58 is selected to form a series resonant tuned circuit with varactor 30 in combination with capacitors 25, 28 and 32 at this other frequency. Resistor 59 is connected in parallel with crystal 56, as show in the drawing. Further positions and contacts can be included in rotary switch 40, and other frequency determining networks similar to those of 46 and 47 can be connected thereto for providing still other center frequencies of oscillation.

The series connection of resistor 60 and resistor 62 provide a DC bias having an accurately regulated amplitude from power supply terminal 64 to varactor 30. This bias determines the quiescent capacitance of the varactor. It is possible for power supply terminal 64 and power supply terminal 14 to be the same terminal. When selector switch 40 is in the position shown, inductor 48 and resistor 52 form a DC return path for the varactor bias current. Capacitor 66 which provides a short for the modulating voltage and DC isolation between the modulation input 68 and varactor 30 is connected to the junction of resistors 60 and 62. Modulating signals or voltages from terminal 68 are coupled through the series connection of capacitor 66 and resistor 62 to be impressed across varactor 30. Inductor 48 and resistor 52 and their counterparts in the other center frequency determining networks are selected to have a low impedance at the frequency of modulation so that they will not diminish the amplitude of the modulating signal. Capacitor 32 isolates the modulating signal from transistor 10 while providing a low impedance path for the oscillating signal. The capacitance of varactor 30 varies above and below its quiescent value according to the amplitude of the modulating voltage to thereby change the resonant frequency of the series resonant circuit within predetermined limits as controlled by the Q of the crystal and by the amplitude of the modulating voltage. The change in capacitance of varactor 30 causes the frequency of oscillation to consequently increase above and decrease below the center frequency of oscillation as determined by the selected center frequency determining circuit.

The frequency modulated signal is coupled from base 16 of transistor 10 by capacitor 70 to load 72. Capacitor 70 is chosen to match the impedance of load 72 to the impedance of the oscillator to provide maximum power transfer from the oscillator to the load.

In a circuit which has been found to be satisfactory for commercial use for operating with crystal frequencies from 16.75 to 19.3 MHz and with both bias supply voltages regulated at 6.8 v., the components have the following values:

| | |
|---|---|
| Transistor **10** | NPN Motorola Type MAS918 |
| Resistor **18** | 56 kilohms |
| Choke **22** | 68 microhenries |
| Resistor **24** | 1 K. |
| Capacitor **25** | 80 picofarads |
| Capacitor **26** | 0.0055 microfarads |
| Capacitor **28** | 470 picofarads |
| Varactor **30** | Motorola Type 1N5146 |
| Capacitor **32** | 470 picofarads |
| Inductor **48** | 1.4—3.3 microhenries (variable) |
| Crystal **50** | Motorola YUSW Type |
| Resistor **52** | 470 ohms |
| Crystal **56** | Motorola YUSW Type |
| Inductor **58** | 1.4—3.3 Microhenries (variable) |
| Resistor **60** | 4.7 K. |
| Resistor **62** | 10 K. |
| Capacitor **66** | 0.22 microfarads |

What has been described, therefore, is a simple crystal controlled, frequency modulated oscillator having a configuration which is adaptable to provide multiple center frequency outputs. One terminal of the crystal in each of the center frequency determining circuits is connected to ground and it is operated in the series resonant mode to provide a frequency which is stable with temperature variations and changes linearly with change in varactor capacitance. The inductors of each of the center frequency determining networks can be independently adjusted to provide the desired frequencies of operation and the resistors suppress unwanted modes of oscillation. The configuration of the oscillator utilizes a minimum number of parts and, therefore, can be advantageously used in solid state, portable or hand held electronic equipment which must be compact, reliable and operate with maximum efficiency.

I claim:

1. In a frequency modulated oscillator having an electron device for sustaining oscillations and a frequency determining circuit connected to the electron device, such frequency determining circuit including in combination:

voltage variable capacitance means having first and second electrodes and providing different values of capacitance between said first and second electrodes in response to voltages of different magnitudes applied thereacross, means coupling said first electrode to the electron control device;

switch means having a first terminal coupled to said electrode, a plurality of second terminals, and a switchable member arranged to selectively connect said first terminal to any one of said plurality of second terminals;

means providing a reference potential;

a plurality of networks each including a piezoelectric element connected in series with inductor means, said piezoelectric element being operated in a series resonant mode, each of said plurality of networks being connected between one of said plurality of second terminals of said switch means and said reference potential means so that a selected one of said networks is coupled to said voltage variable capacitance means by said switchable member;

a series circuit having a resonant frequency which establishes the center frequency of oscillation of the oscillator and including said voltage variable capacitance means connected to said selected one of said networks; and modulating voltage supply means providing a modulating voltage, means coupling said modulating voltage supply means to said series circuit and applying said modulating voltage thereacross, said voltage variable capacitance means being responsive to said modulating voltage to change its said capacitance therewith to deviate the frequency of oscillation about said center frequency.

2. A frequency modulated crystal controlled oscillator including in combination:

an electron device having a first electrode and a second electrode;

means providing a reference potential;

first capacitor means connected between said means providing the reference potential and said first electrode;

second capacitor means connected between said first electrode and said second electrode;

third capacitor means having first and second plates, said first plate being connected to said second electrode;

varactor means having an anode terminal and a cathode terminal, one of said anode and cathode terminals being directly connected to said second plate of said third capacitor means so that said varactor means is coupled through said third capacitor means to said second electrode;

switch means having a first terminal connected to the other of said anode and cathode terminals, a plurality of second terminals and a switchable member for connecting a selected one of said plurality of said second terminals to said first terminal;

a plurality of networks each including a piezoelectric element subject to operating in spurious modes of oscillation, said piezoelectric element being connected from said means providing the reference potential to a circuit junction, first resistive means connected in parallel with said piezoelectric element for damping out said spurious modes of oscillation, inductor means connected between said circuit junction and one of said plurality of output terminals of said switch means;

a series resonant circuit comprised of said first capacitor means, said second capacitor means, said third capacitor means, said switchable member and said varactor means, for determining a selected center frequency of oscillation of said oscillator; and modulating voltage supply means providing a modulating voltage at its output, first circuit means connected between said one of said anode and cathode terminals of said varactor means and said output of said modulating voltage supply means so that a modulating voltage is supplied to said varactor means which deviates the frequency of oscillation of the oscillator about said selected center frequency.

3. The oscillator of claim 2 wherein said first circuit means includes:

fourth capacitor having first and second plates, said first plate of said fourth capacitor means being coupled to said output of said modulating voltage supply means;

second resistor means having a first end connected to said second plate of said fourth capacitor means and a second end connected to said varactor means so that said modulating voltage is applied through said fourth capacitor and said second resistor to said varactor means;

direct current bias source; and third resistor means connected from said direct current bias source to said first end of said second resistor means so that a quiescent bias voltage is supplied from said bias source to said varactor means through said second and third resistor means.

4. The combination of claim 1 wherein said inductor means is variable to change said resonant frequency of said series tuned circuit and to thereby adjust said center frequency of oscillation of the oscillator.

5. The combination of claim 1 wherein each of said piezoelectric elements is capable of operating at spurious modes of oscillation, and further including, direct current supply connected to said voltage variable capacitance means and providing a direct current bias voltage thereto, a plurality of first resistor means each connected directly across each of said piezoelectric elements to reduce said spurious modes of oscillation and to provide a direct current path for said voltage variable capacitance means.

6. The combination of claim 1 wherein said piezoelectric elements of said networks are quartz crystals having different frequencies of oscillations with respect to each other.

7. An oscillator in accordance with claim 2 wherein said electron device is a transistor and said piezoelectric elements are quartz crystals.

8. An oscillator in accordance with claim 2 wherein said inductor means is variable to change the tuning of said series resonant circuit to thereby adjust said center frequency of oscillation of the oscillator.

UNITED STATES PATENT OFFICE

CERTIFICATE OF CORRECTION

Patent No. 3,581,240 Dated May 25, 1971

Inventor(s) Ralph T. Enderby

It is certified that error appears in the above-identified patent and that said Letters Patent are hereby corrected as shown below:

Column 4, line 14, after "said", insert -- second -- .

Signed and sealed this 31st day of October 1972.

(SEAL)
Attest:

EDWARD M.FLETCHER,JR.
Attesting Officer

ROBERT GOTTSCHALK
Commissioner of Patents